United States Patent
Chitnis et al.

(10) Patent No.: US 9,368,428 B2
(45) Date of Patent: Jun. 14, 2016

(54) DIELECTRIC WAFER LEVEL BONDING WITH CONDUCTIVE FEED-THROUGHS FOR ELECTRICAL CONNECTION AND THERMAL MANAGEMENT

(75) Inventors: Ashay Chitnis, Goleta, CA (US); James Ibbetson, Santa Barbara, CA (US)

(73) Assignee: CREE, INC., Goleta, CA (US)

( * ) Notice: Subject to any disclaimer, the term of this patent is extended or adjusted under 35 U.S.C. 154(b) by 900 days.

(21) Appl. No.: 11/732,559

(22) Filed: Apr. 3, 2007

(65) Prior Publication Data

US 2007/0284602 A1    Dec. 13, 2007

Related U.S. Application Data

(63) Continuation-in-part of application No. 11/171,893, filed on Jun. 30, 2005, now Pat. No. 7,329,905.

(60) Provisional application No. 60/584,187, filed on Jun. 30, 2004.

(51) Int. Cl.
  *H01L 23/48* (2006.01)
  *H01L 33/00* (2010.01)
  *H01L 33/38* (2010.01)
  *H01L 33/64* (2010.01)

(52) U.S. Cl.
  CPC .......... *H01L 23/481* (2013.01); *H01L 33/0079* (2013.01); *H01L 33/382* (2013.01); *H01L 33/64* (2013.01); *H01L 33/647* (2013.01); *H01L 2924/0002* (2013.01); *H01L 2924/3011* (2013.01)

(58) Field of Classification Search
  USPC .......................................................... 257/99
  See application file for complete search history.

(56) References Cited

U.S. PATENT DOCUMENTS

| | | | |
|---|---|---|---|
| 4,889,832 A * | 12/1989 | Chatterjee | 438/270 |
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 6,087,244 A * | 7/2000 | Jeon | 438/426 |
| 6,236,103 B1 * | 5/2001 | Bernstein et al. | 257/532 |
| 6,521,923 B1 * | 2/2003 | D'Anna et al. | 257/288 |
| 7,132,746 B2 | 11/2006 | Brandenburg et al. | 257/713 |

(Continued)

OTHER PUBLICATIONS

Accuratus in Aluminum Nitride, AlN Material Characteristics: Aluminum Nitride Engineering Properties, 2002, accessed online on Aug. 12, 2011 at http://accuratus.com/alumni.html.*

(Continued)

*Primary Examiner* — Michael Jung
(74) *Attorney, Agent, or Firm* — Koppel, Patrick, Heybl & Philpott

(57) ABSTRACT

A method for fabricating semiconductor and electronic devices at the wafer level is described. In this method, dielectric material is used to wafer bond a device wafer to a submount wafer, after which vias can be structured into the submount wafer and dielectric bonding material to access contact pads on the bonded surface of the device wafer. The vias may subsequently be filled with electrically and thermally conducting material to provide electrical contacts to the device and improve the thermal properties of the finished device, respectively. The post-bonding process described provides a method for fabricating a variety of electronic and semiconductor devices, particularly light emitting diodes with electrical contacts at the bottom of the chip.

46 Claims, 5 Drawing Sheets

(56) References Cited

U.S. PATENT DOCUMENTS

| | | | | |
|---|---|---|---|---|
| 7,271,491 | B1* | 9/2007 | Akram | 257/774 |
| 7,416,962 | B2 | 8/2008 | Harrison et al. | 438/459 |
| 7,513,035 | B2 | 4/2009 | Too et al. | 29/832 |
| 7,851,348 | B2 | 12/2010 | Misra et al. | 438/618 |
| 2003/0080408 | A1* | 5/2003 | Farnworth | H01L 21/486 257/698 |
| 2003/0151051 | A1* | 8/2003 | Johnson et al. | 257/77 |
| 2003/0160256 | A1* | 8/2003 | Durocher et al. | 257/88 |
| 2004/0130002 | A1* | 7/2004 | Weeks et al. | 257/622 |
| 2004/0217360 | A1* | 11/2004 | Negley | 257/79 |
| 2006/0006404 | A1* | 1/2006 | Ibbetson et al. | 257/99 |
| 2006/0138436 | A1* | 6/2006 | Chen et al. | 257/98 |
| 2006/0163596 | A1* | 7/2006 | Kim et al. | 257/98 |
| 2006/0237735 | A1 | 10/2006 | Naulin et al. | 257/98 |
| 2007/0012970 | A1* | 1/2007 | Mouli | 257/292 |
| 2007/0275537 | A1* | 11/2007 | Henson et al. | 438/421 |
| 2007/0284602 | A1 | 12/2007 | Chitnis et al. | 257/98 |
| 2008/0096365 | A1* | 4/2008 | Chitnis | 438/455 |
| 2008/0283960 | A1* | 11/2008 | Lerner | 257/508 |

OTHER PUBLICATIONS

Definition of fill. (n.d.) American Heritage® Dictionary of the English Language, Fifth Edition. (2011). Retrieved Nov. 15, 2015 from http://www.thefreedictionary.com/fill.*
Office Action from U.S. Appl. No. 11/584,135, dated: May 17, 2010.
Response to Office Action from U.S. Appl. No. 11/584,135, filed: Aug. 16, 2010.
Office Action from U.S. Appl. No. 11/584,135, dated: Sep. 15, 2010.
Response to Office Action from U.S. Appl. No. 11/584,135, filed: Mar. 8, 2011.
Office Action from U.S. Appl. No. 11/584,135, dated: Mar. 14, 2011.
Response to Office Action from U.S. Appl. No. 11/584,135, filed: May 13, 2011.
Office Action from U.S. Appl. No. 11/584,135, dated: Jun. 1, 2011.
Response to Office Action from U.S. Appl. No. 11/584,135, filed: Jun. 3, 2011.
Office Action from U.S. Appl. No. 11/584,135, dated: Jan. 27, 2012.
Response to Office Action from U.S. Appl. No. 11/584,135, filed: Mar. 27, 2012.
Office Action from U.S. Appl. No. 11/584,135, dated: Apr. 6, 2012.
Response to Office Action from U.S. Appl. No. 11/584,135, filed: Apr. 20, 2012.
Office Action from U.S. Appl. No. 11/584,135, dated: May 10, 2012.
Office Action from U.S. Appl. No. 11/584,135, dated Apr. 1, 2013.
Response to OA from U.S. Appl. No. 11/584,135, filed Jun. 24, 2013.
Office Action from U.S. Appl. No. 11/584,135, dated Sep. 24, 2012.
Response to OA from U.S. Appl. No. 11/584,135, filed Nov. 26, 2012.
Office Action from U.S. Appl. No. 11/584,135, dated Sep. 23, 2013.
Office Action from U.S. Appl. No. 11/584,135, dated Dec. 4, 2013.
Office Action from U.S. Appl. No 11/584,135, dated Jun. 12, 2014.
Office Action from U.S. Appl. No. 11/584,135, dated Jun. 26, 2014.
Office Action from U.S. Appl. No. 11/584,135, dated Jul. 6, 2015.
Office Action from U.S. Appl. No. 11/584,135, dated Mar. 17, 2015.

* cited by examiner

DIELECTRIC WAFER LEVEL BONDING WITH CONDUCTIVE FEED-THROUGHS FOR ELECTRICAL CONNECTION AND THERMAL MANAGEMENT

RELATED APPLICATION DATA

This application is a continuation-in-part of U.S. application Ser. No. 11/171,893 filed Jun. 30, 2005, issued as U.S. Pat. No. 7,329,905 B2 on Feb. 12, 2008, which claims the benefit of U.S. Provisional patent application Ser. No. 60/584,187 filed Jun. 30, 2004.

STATEMENT AS TO FEDERALLY SPONSORED RESEARCH

This invention was made with Government support under contract no. 70NANB4H3037 awarded by the Department of Commerce. The federal government may have certain rights in the invention.

BACKGROUND OF THE INVENTION

1. Field of the Invention

The present invention relates to electronic and semiconductor devices, and more particularly to light emitting devices and methods of fabricating light emitting devices.

2. Description of Related Art

Light emitting diodes and laser diodes are well known solid state electronic devices capable of generating light upon application of a sufficient voltage. Light emitting diodes and laser diodes may be generally referred to as light emitting devices (LEDs). Light emitting devices generally include a p-n junction formed in an epitaxial layer grown on a substrate such as sapphire, silicon, silicon carbide, gallium arsenide and the like. The wavelength distribution of the light generated by the LED depends on the material from which the p-n junction is fabricated and the structure of the thin epitaxial layers that include the active region of the device.

LED chips are mounted in various packages for different applications. One example of an LED based lamp product is offered by Cree Inc. as its XR-E product and combines the brightness of LED chips and rugged packaging technology well suited for solid state lighting industry. The XR-E package comprises an LED chip mounted onto a substrate along with optical, electrical and mechanical components assembled to provide 80 lm of white light at 350 mA with efficient thermal management. One important feature of these products is the electrical feed-throughs that route the device electrodes to the backside of the substrate thus making it a surface mount type device; a preferred package configuration in solid state lighting industry.

Although the XR-E products deliver 80 lm of light, there is considerable effort to further improve performance levels of existing LEDs to keep the $/lm/Watt number low. In addition of increasing the chip efficiency, the package manufacturing size and hence the cost needs to be reduced. One approach to reduce package related cost is by wafer level packaging, i.e component assembly/integration at wafer level.

To realize full component integration in semiconductor devices, an understanding of materials compatibility is important. Si is inexpensive and has good thermal, mechanical and electrical properties. Its oxide serves as an excellent dielectric layer in IC manufacturing, as well as an etch stop layer in micromachining applications for MEMS devices. However, Si's limited bandgap and its modest mobilities can limit device performance and restrict optical applications. Alternatively, gallium arsenide (GaAs) and other compound semiconductors with better bandgap characteristics or mobilities can also be used, but such materials are generally more costly.

Recent developments in wafer-bonding technology have provided the means to integrate different materials into semiconductor devices. Wafer bonding is a semiconductor manufacturing process in which two semiconductor wafers are bonded to form a single substrate having specific properties. A variety of bonding methods can be used to create integrated electronics, and to combine multifunctional components onto a single die. In particular, wafer bonding provides a means for unifying different materials in semiconductor devices, thus allowing the creation of new devices and microcomponents having properties that cannot be achieved using a single material or single material system. Wafer bonding is commonly used to form silicon-on-insulator (SOI) substrates and can also be used to bond wafers composed of different materials (e.g. GaAs on Si, SiC on Si).

The choice of wafer bonding process used to fabricate a device is dependent upon the type of device, particularly the components and materials used to build the device. For example, eutectic wafer bonding is based on the use of bonding materials that form a eutectic alloy at specific temperature conditions, and eutectic bonding media such as Au—Si, Au—Sn or Pd—Si are widely used. Eutectic bonding meets the demand for hermetic as well as vacuum sealing for many Microsystems and is frequently used for MEMS devices and advanced packaging. Eutectic wafer bonding using AuSn, for example, can provide the requisite range of thermal impedance (from junction to board) in an EZ™-type LED device (e.g. about 5-10° C./W for high power chips). However, wafer bonding with eutectic materials is currently limited to vertical device geometries where the second electrical contact is provided by a wire bond to the top of the chip. For chip scale packages (e.g. flip chips), it would be advantageous to create devices at the wafer level with both electrical contacts on the bottom of the chip, such as those described in U.S. Pat. No. 7,329,905 B2, assigned to Cree Inc. This would require electrically and thermally conducting bond medium selectively deposited to avoid electrical shorting. Alternatively, if a blanket electro-conducting bond medium is used, then additional processing steps are required to selectively etch the bond medium. Also, selective area wafer alignment bonding is slow and requires the use of costly alignment procedures.

Dielectric materials can also be used for wafer bonding. However, dielectric films are electroinsulating and typically have poor thermal characteristics such that the thermal impedance of a device bonded using dielectric material is expected to be much higher than one bonded using eutectic material. One approach to minimizing impedance is to reduce the thickness of the dielectric bond medium. However, the thickness of the bond medium is crucial to minimize stress effects during bonding of dissimilar materials, and thus there is a practical limit to how thin it can be (i.e. at least about one micron) in a conventional device.

SUMMARY OF THE INVENTION

Briefly, and in general terms, the present invention is directed to wafer bonded devices and wafer level bonding methods which increase the number of device types accessible to wafer bonding while minimizing the need for selective wafer alignment. In particular, the present invention uses a bond medium containing dielectric material to achieve permanent wafer level bonding prior to singulation.

One embodiment of a method of fabricating an integrated circuit chip according to the present invention comprises providing a first wafer with a first surface and a second surface, and providing a second wafer with a first surface and a second surface. A bond medium layer is provided comprising dielectric material and at least one portion of the second surface of the first wafer is wafer bonded to at least one portion of the first surface of the second wafer using the bonding medium, thereby forming a wafer pair. A via is formed through the second wafer and the bond medium layer with the via in electrical or thermal contact with the first wafer.

One embodiment of an integrated circuit chip according to the present invention comprises a first wafer having a first surface and a second surface, and a dielectric material. A second wafer is included having a first surface and a second surface wherein the second surface of the first wafer and the first surface of the second wafer are wafer bonded together by the dielectric material. A conductive via is also included that is at least partially through the second wafer and the dielectric material.

One embodiment of a light emitting diode (LED) chip according to the present invention comprises an LED and a dielectric medium layer. A submount is included having a first surface and a second surface wherein the dielectric medium layer is between the first surface of the submount and the LED. A conductive via is included at least partially through said submount and the dielectric material, said via accessible from the second surface of the submount wafer to apply an electrical signal to the LED.

These and other aspects and advantages of the invention will become apparent from the following detailed description and the accompanying drawings which illustrate by way of example the features of the invention.

DETAILED DESCRIPTION OF THE INVENTION

Figure 1A:
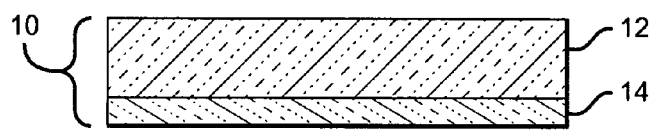
FIGS. 1A-1C are a schematic cross sectional views of one embodiment of an LED wafer according to the present invention at different fabrication steps.

The present invention relates to the devices such as light emitting devices (LEDs) where most of the processing steps occur at the wafer level, thereby reducing overall fabrication costs. The resulting LEDs can also be contacted from the backside, making packaging of the LED easier with the LEDs requiring less packaging space and material.

In particular, the invention relates to the use of electrically insulating, dielectric medium for wafer bonding. In particular the invention introduces a thermally and electrically insulating material at the wafer level without using electro-thermally conducting bond medium. To improve the thermal properties of the finished device, and to provide two electrical contacts to the LED from the bottom of the submount wafer, vias can be fabricated into the submount wafer and bonding medium after the wafer bonding process (post bond). The vias may subsequently be filled with thermally conductive material to improve the thermal properties of the finished device, or with conductive material to provide electrical contacts to the device.

In addition to providing the necessary electrical path for a semiconductor device and ensuring a low thermal resistance path for the heat flow, post-bond fabrication of metal-filled vias offers several other advantages. It can eliminate the necessity of using the slow and costly selective area alignment bonding technique which can be used, for example, to route n- and p-contact pads onto a semiconductor substrate wafer. It can also eliminate stress effects during the bond cycle which arise from CTE coefficient of thermal expansion (CTE) mismatch of via material and surrounding carrier/substrate material. Post-bond fabrication also avoids the high probability of mechanical failure in a metal-filled via substrate (i.e. a discontinuous lattice) fabricated prior to bonding and subsequently bonded by applying, for example, a pressure of around 10 psi.

An additional advantage of post-bond via fabrication is that it requires less accuracy. Submount wafer thickness for wafer level bonding is typically about 250-300 microns. If the metal-filled vias are fabricated before wafer bonding, then the depth of the via needs to be the same as that of the submount wafer to route the contact pads on the back-side of the submount wafer as required, and fabricating such a high aspect ratio via is very challenging. Similarly, although another approach might be to fabricate shallow vias and then thin the submount wafer from the backside to access the vias that would increase the number and complexity of processing steps. In addition, fabricating via substrates prior to bonding requires tight control of the via process technology to achieve best possible surface planarity, which is an important requisite for wafer bonding.

Other features and advantages of the invention will be apparent from the following detailed description when taken together with the drawings, and from the claims. The following description presents preferred embodiments of the invention representing the best mode contemplated for practicing the invention. This description is not to be taken in a limiting sense but is made merely for the purpose of describing the general principles of the invention whose scope is defined by the appended claims.

Before addressing details of embodiments described below, some terms are defined or clarified. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise. As used herein, the term "on" or "adjacent to" when referring to a layer or coating on a particular surface does not necessarily mean that the layer or coating is immediately next to the surface. There may or may not be another contiguous or non-contiguous layer, coating, or material present between the layer or coating described and the surface, and the surface itself can be another layer or coating.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Embodiments of the present invention are described herein with reference to cross-section, plan-view and/or perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded, curved or graded features at its edges rather than a discrete change from one region to the next. Thus, the regions illustrated in the figures are schematic in nature and their shapes are not intended to illustrate the precise shape of a region of a device and are not intended to limit the scope of the present invention.

Attention is now directed to more specific details of embodiments that illustrate but not limit the invention. The following description includes definitions that refer to the particular embodiments described herein and are not to be taken as limiting. It is understood that the invention includes equivalents for other undescribed embodiments.

In one of several aspects, the invention relates to a method of fabricating a semiconductor device which includes bonding a submount wafer to a semiconductor substrate wafer using dielectric material. Many different materials can be used for the dielectric material and in one embodiment of the present invention the dielectric material is electrically insulating. As used herein, the term "wafer" is intended to mean a thin slice of semiconductor material used in manufacturing semiconductor devices and integrated circuits. As used herein, the term "submount wafer" is intended to mean a support layer in a packaged device. Non-limiting examples of submount wafers include substrates, circuit boards, MEMS, and carriers. Submount wafers are generally found in flip chip packaged devices, where they may have one or more functions including without limitation providing support for, or connecting the electronic components of, a device wafer. As used herein, the "substrate" or "substrate wafer" is intended to mean the base layer in a device structure including without limitation a chip, multichip module (MCM), circuit board, disk platter, lead frame, or heat sink. A substrate provides, for example, the basis for subsequent processing operations in the fabrication of semiconductor devices or integrated circuits. A non-limiting example of a substrate includes a small, thin circular slice of a semiconducting material on which an integrated circuit or flip chip can be formed.

In another aspect, the method includes post-bond via fabrication where holes are etched through the submount wafer for via formation. The via holes can then be filled with thermally conductive material to improve the thermal properties of the finished device, or with conductive material to provide electrical contacts to the device. In other embodiments where the submount wafer is conductive or semiconductive, the via holes can be covered with a passivation material or be subjected to low-temperature ion implantation prior to filling with a conductive material. This arrangement helps reduce or prevent leakage current between vias during device operation.

Figure 1B:
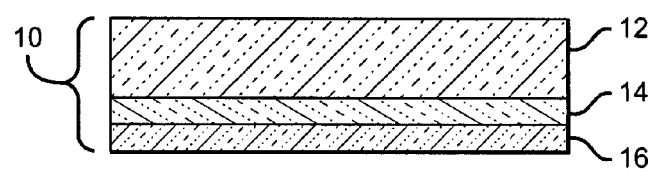
Figure 1C:
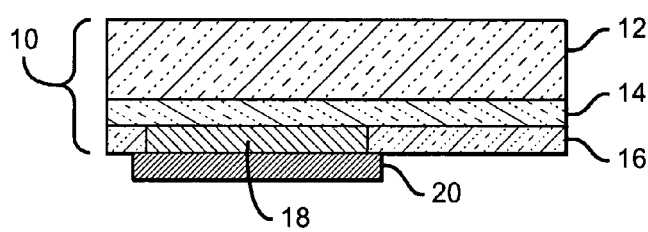
Figure 2:
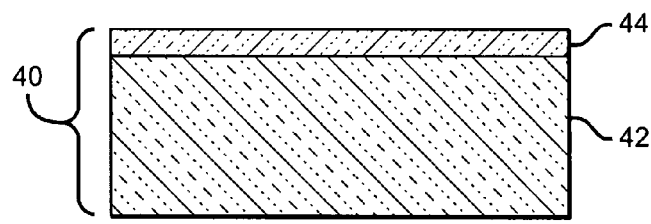
FIG. 2 is a schematic cross sectional view of one embodiment of a submount wafer according to the present invention.

FIGS. 1-3 are schematic diagrams showing one embodiment of a semiconductor device according to the present invention during the wafer bonding and post-bond via fabrication process described above. This embodiment is described with reference to an LED, but it is understood that process can be used with many other semiconductor devices, and in particular any two or more terminal semiconductor devices. As used herein, the term "wafer bonding" is intended to mean a method for bonding wafers together, or to other substrates, to form larger more complex devices. Wafer bonding techniques include without limitation anodic (electrostatic) bonding, fusion bonding, adhesive bonding, eutectic bonding, solder bonding, thermo-compression and glass frit bonding. For clarity, FIGS. 1-3 show a single LED being processed, but it is understood that the present invention can be utilized for processing at the wafer level where a plurality of LEDs can be formed at the wafer level and then separated into individual devices.

FIGS. 1A-1C show the preparation of an LED wafer 10 prior to wafer bonding. Referring to FIG. 1A, the wafer 10 in this embodiment can be prepared by first prepping a suitable LED grown substrate 12 and then depositing a one or more epitaxial layers 14 on one side of the substrate. In most embodiments more than one layer is deposited to form a device such as an LED. As used herein, the term "depositing" or "deposition" when referring to an epitaxial material refers to conventional deposition processes including but not limited to metalorganic chemical vapor deposition (MOCVD). When referring to other materials, "depositing" and "deposition" is intended to mean any viable method of deposition or application including without limitation electrode or electrode-less vacuum deposition, evaporation, sputtering, layering, sprinkling, beading, extruding, patterning, printing, plating, soldering, or spraying.

The fabrication and operation of LEDs is generally known in the art and only briefly discussed herein. The layers 14 can be fabricated using known methods generally comprise an active layer/region sandwiched between first and second oppositely doped epitaxial layers all of which are formed successively on the substrate 12. As used herein, the term "epitaxial layer" is intended to mean a semiconductor layer formed on a substrate. An epitaxial layer can have the same crystalline orientation as the substrate on which it is grown, and both can be single crystal. In some cases the epitaxial layer may be a completely different type of material than the substrate upon which it is grown.

It is understood that additional layers and elements can also be included in the LED, including but not limited to buffer, nucleation, contact and current spreading layers as well as light extraction layers and elements. The active region can comprise single quantum well (SQW), multiple quantum well (MQW), double heterostructure or super lattice structures. In one embodiment, the first epitaxial layer is an n-type doped layer and the second epitaxial layer is a p-type doped layer, although in other embodiments the first layer can be p-type doped and the second layer n-type doped.

The layers 14 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, n- and p-type layers are gallium nitride (GaN) and an active region is InGaN. In alternative embodiments n- and p-type layers may be AlGaN, aluminum gallium arsenide (AlGaAs) or aluminum gallium indium arsenide phosphide (AlGaInAsP).

The substrate 12 can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 12 is at the wafer level, with the plurality of LEDs formed on the wafer substrate 12.

Referring now to FIG. 1B, an etch stop and etch mask layer 16 can then be deposited adjacent to the epitaxial layer 14. Many different materials can be used for layer 16, including but not limited to silicon nitride (SiN) or silicon dioxide (SiO$_2$). In different embodiments the etch mask layer can be further processed to form additional features, such as bond pads, reflective elements, light extraction elements, etc. In still other embodiments, these features can be formed at other stages of the fabrication process, such as before formation of the etch layer 16.

Referring now to FIG. 1C, etch layer 16 can be etched to form an opening to the layer 14. Different known etching processes can be used such as chemical, physical or laser etching. A reflective layer 18 can then be deposited in the opening, with the preferred reflective layer 18 being composed of different reflective materials, including without limitation silver (Ag), aluminum (Al), gold (Au) and combinations thereof. In other embodiments, a bond pad can be deposited in the opening without a reflective layer. In the embodiment shown, a bond pad 20 is deposited on the reflective layer 18 and partially on the etch layer 16. As used herein, the term "bond pad" refers to a contact, with one type of contact being a metal contact. These can also include without limitation metal stacks or wrap layers. The type of metal used for the bond pad may vary according to the requirements of the process or device, including without limitation any noble metal such as platinum (Pt), palladium (Pd), aluminum (Al) gold (Au), tungsten (Tn), titanium (Ti) or combination thereof. One ore more conventional metal deposition can be used to fabricate bond pads and reflective layers, including without limitation vacuum deposition, thermal evaporation, and electroplating.

In one embodiment, a layer of wafer binding material (not shown) can be deposited adjacent to exposed portions on the surface of the LED wafer 10, such as over the etch layer 16 and bond pad layer 20 in preparation for wafer bonding. In particular, the binding material can bind the LED wafer 10 to a submount wafer as described below. The layer of wafer binding material can also be planarized or otherwise processed in preparation for wafer bonding.

FIG. 2 shows the preparation of a submount 40 prior to wafer bonding. The submount 40 comprises a submount wafer 42, and a variety of materials can be used for submount wafers according to the invention, including without limitation Si, Ge, SiC, and AlN. In one embodiment, a dielectric layer 44 can be deposited onto the submount wafer 42 prior to deposition of the bond medium. The presence of the dielectric layer can increase the effectiveness or strength of wafer bonding or enhance etch selectivity when a targeted etch depth is required in the submount wafer. Dielectric materials useful for the invention include without limitation SiO$_2$ and SiN, although other materials may also be used. The thickness of the dielectric layer can vary from about 0.01 micron to about 25 to 80 microns. Preferably, the thickness of the dielectric layer can range from about 0.1 to about 10 microns. Besides dielectric, metal such as titanium (Ti), nickel (Ni), tungsten (W) or a combination thereof can also be used as stop layer during via etch or adhesion layer for the bond medium.

FIGS. 3A-G show a wafer bonded configuration and post-bond via fabrication steps for an LED wafer 10 wafer bonded to a submount wafer 40 according to one embodiment of the invention. The process for depositing the bond medium and bonding the wafers may vary according to device type and application. In this embodiment, which could be used to fabricate a flip chip device, a bond medium layer 50 is first deposited on the LED wafer 10 over the exposed etch layer 16 and bond pad layer 20. The submount 40 is then placed on the layer of bond medium layer 50 such that the dielectric layer 44 (if present) is adjacent to the bond medium layer 50, and the two wafers are subjected to wafer bonding. In another embodiment, the bond medium could be deposited on the submount wafer prior to bonding. In yet another embodiment, the bond medium layer can be deposited on both the LED wafer 10 and the submount 40 prior to wafer bonding. In a further embodiment, the bond medium layer could be provided as a preform which is manually aligned with, and sandwiched between, the LED wafer 10 and the submount 40 prior to wafer bonding.

As mentioned above, the bond medium layer preferably comprises one or more dielectric materials. A variety of dielectric wafer bonding media are suitable for the invention, including without limitation polyimides, resins, SiO$_2$ SiN, thermal oxide, benzocyclobutene (BCB), polymethyl methacrylate (PMMA), and derivatives thereof. Preferably, the bond medium is electrically insulating. The thickness of the dielectric layer of bond medium can vary from about 100-Å to about 80 microns. Preferably, the thickness of the dielectric layer is within a range from about 0.1 to about 10 microns. Variety of dielectric wafer bonding schemes such as thermocompression, thermal, anodic, plasma can be used. Bonding can be accomplished at room or at high temperatures. Pressure can be used during bonding to limit minimize total thickness variation of the bonded wafer pair. Bonding can be accomplished using photo-curable and microwave curable bond medium.

Figure 3A:
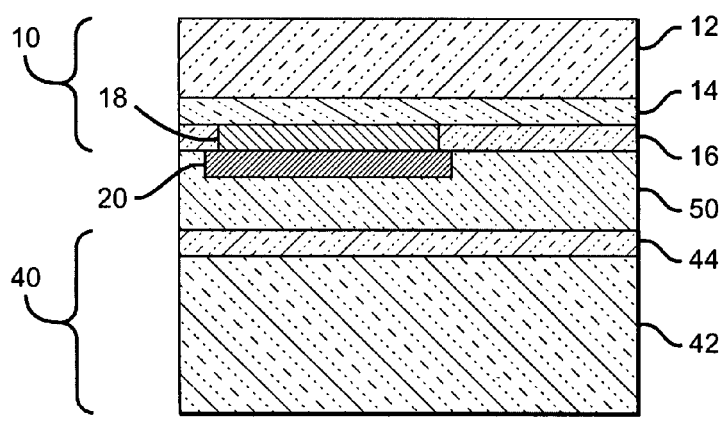
FIGS. 3A-3G are schematic cross sectional views of the LED wafer in FIGS. 1A-1C wafer bonded to the submount wafer in FIG. 2 according to one embodiment of the present invention.

FIG. 3A is a schematic cross sectional view of the LED wafer 10 shown in FIG. 1C wafer bonded to the submount 40 shown in FIG. 2, with the bonding medium layer 50 between the LED wafer 10 and the submount 40. After wafer bonding, one or more vias 52 can be fabricated into the submount 40 and bonding medium layer 50 as needed for a particular device or application. In the embodiment shown, the vias 52 is formed in alignment with the bond pad 20. The vias 52 can be aligned with the bond pad 20 without using difficult and costly alignment processes. In the preferred embodiment, the submount wafer 42, dielectric layer 44 and bonding medium layer 50 are substantially transparent in the infrared (IR) or visible wavelength spectrum. This allows for the bond pad 20 to be visible in these spectrums for alignment with the via 52. Conventional IR or visible mask alignment methods can be used according to the present invention that are less costly and complicated than wafer level alignment bonding.

Figure 3B:
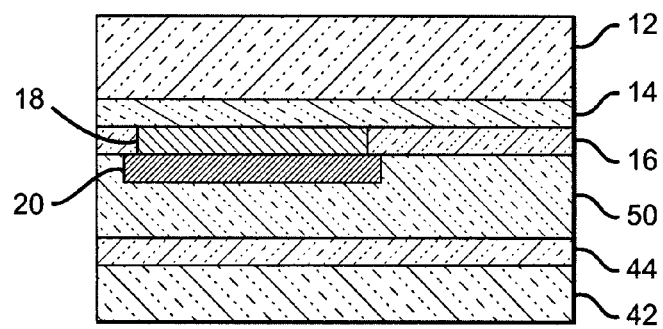

The process may be made more cost effective and robust by first thinning the submount wafer 42 to the desired thickness after wafer bonding, as shown in FIG. 3B. Via fabrication carried out after thinning of the submount wafer, can produce vias having low aspect ratio without using selective area wafer alignment, thereby reducing or eliminating the length or complexity of the fabrication process. Submount wafer thinning can be achieved in several ways, including without limitation grinding or back-thinning. Vias can be fabricated using known physical and chemical etching techniques.

Figure 3C:
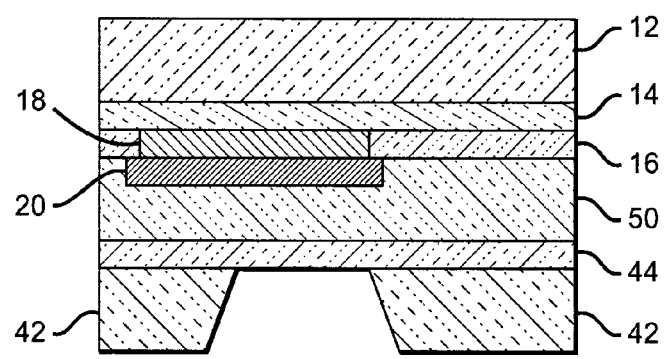
Figure 3D:
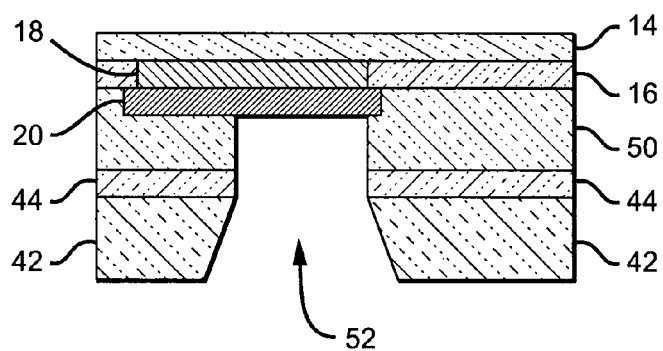

As shown in FIGS. 3C and 3D, shallow vias 52 can then be etched into the submount wafer 42 and the bond medium layer 50 from the bottom surface in order to access the corresponding device contact pads (e.g. p pads) on the bonded surface of the LED wafer (e.g. backside trench etch). Post-bond via etching can be achieved using a variety of etching techniques, including without limitation wet or dry etching, laser ablation, and plasma etching. The number, shape and dimensions of the vias in a device may vary depending on the type of device of application. The width can typically range from about 1 microns to about 500 microns and the height from about 5 microns to about 1 mm. A variety of shapes and orientations are also possible, including circular, square, pyramid and inverted pyramids. The height can typically range from about 5 microns to about several hundred microns. In one embodiment, a via structure could have the following dimensions: bottom width about 300 microns, top width about 100-150 microns; height about 70-100 microns.

Figure 3E:
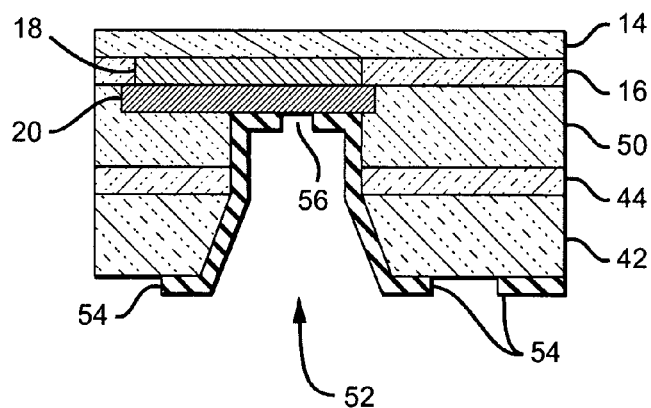

As best shown in FIG. 3E, a passivation layer 54 can then be deposited on the surface of the vias 52 for electrical isolation. This is particularly applicable to embodiments having conductive or semiconductive submount wafer or other arrangements that are susceptible to leakage current between vias. Materials suitable for the passivation layer 54 include without limitation dielectric materials such as polyimides. In other embodiments, the surface of the vias can be subjected to low temperature doping implantation to reduce or prevent leakage current between vias. In embodiments utilizing a passivation layer 54, a hole 56 is formed at the top of the via such as be etching, to expose the surface of the bond pad 20.

Figure 3F:
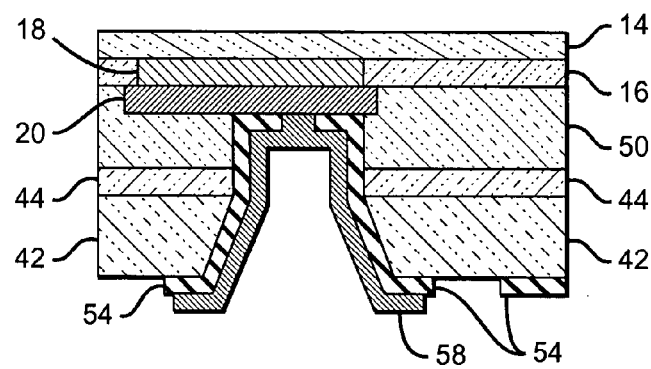

The vias can be fully or partially filled or covered with thermally or electrically conductive material in order to improve the thermal properties of the finished device or to provide electrical contacts to the device, respectively. FIG. 3F shows the via surface conformally with an electrically conductive layer 58 to provide electrical contact to the bond pad through the conductive layer 58. Conformal metal coating of the vias can be achieved using vacuum deposition such as sputter, ebeam. Other techniques such as electroplating, electroless plating, spin coating can also be used.

Figure 3G:
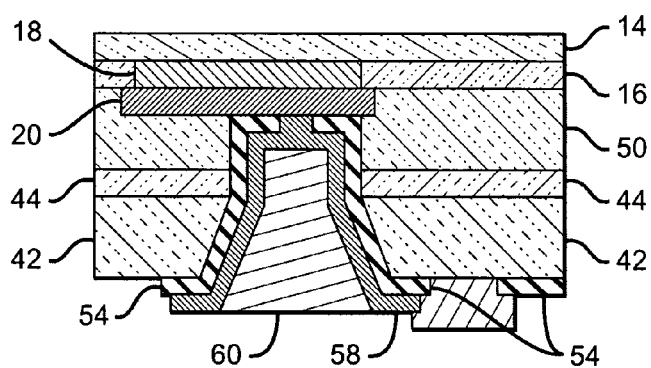

The remainder of the via can also be filled to assist in thermal or electrical conduction. Referring to FIG. 3G, the via 52 is filled with thermally conductive material 60. Suitable via fill materials include, without limitation, metal-filled epoxy, plated metals such as such as copper (Cu), conducting inks, and polymers such as CB100 ViaPlug Material™ (Du Pont de Nemours & Co., Wilmington, Del., U.S.A.). The vias can be filled by depositing the fill material within a via using standard deposition techniques including without limitation electrode deposition, soldering, electroplating and screen printing. Non-limiting examples of methods for filling vias include electroplating for depositing electrically conducting material or screen printing for depositing thermally conducting material. Preferably, the vias are filled with both electrically and thermally conducting material.

Following the fill procedure, the assembled structure may be subjected to curing or planarization prior to further processing steps such as metallization to create contacts on the back side of the device and the addition of phosphors, reflective layers, lenses, or other optical components. These components generally must survive condition required to solder the device to a circuit board, typically greater than about 100-300° C.

The above processing steps are accomplished at the wafer level and the wafer can be separated into individual devices shown in FIG. 3F using known processes. Contact to devices is made by connection to the bottom surface of the submount 40 at the via 52, and in particular it's conductive layer 58. Thus, the device may be attached directly to a circuit board or other carrier by solder bonding, epoxy bonding or other methods. Since device separation occurs last, most of the package processing is done at the wafer level, which may substantially decrease the overall cost of packaging the device. Reducing the packaging cost per die may in turn decrease the cost per lumen of light output by the packaged parts. In addition, the resulting packaged device may be relatively small which permits placement of the packaged device in a smaller footprint compared to a conventional package and results in conservation of space on a PCB. By providing a smaller, chip-scale package, secondary optics (e.g. other lenses or reflectors in the system) may also be made more compact and affordable.

The present invention can be used for fabricating many different devices arranged in many different ways. FIGS. 4A, 4B, 5A and 6A-6F show fabrication of another embodiment of an LED according to the present invention utilizing one embodiment of a method according to the present invention. The fabrication of a single device is shown, but like the embodiment above it is understood that the devices can be formed at a wafer level and then separated into individual devices.

Figure 4A:
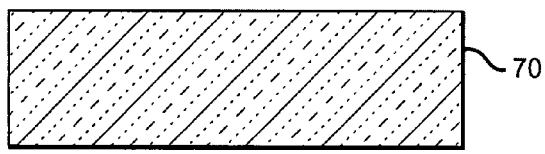
FIGS. 4A and 4B are schematic cross sectional views of another embodiment of a submount wafer according to the present invention.
Figure 4B:
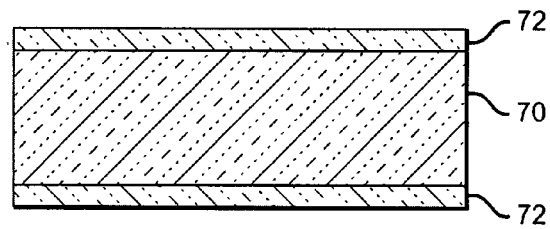

FIG. 4A shows a submount wafer 70 that can be made of the same materials as submount wafer 42 described above, with the preferred submount wafer being Si. FIG. 4B shows the submount wafer 70 with a etch stop and etch mask layer 72 on each of the opposing lateral surfaces of the submount wafer 70. Many different materials can be used for the layer(s) 72 including $SiO_2$, polymides, and BCB, with the preferred material being SiN.

Figure 5:
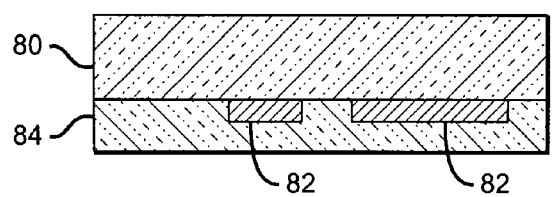
FIG. 5 is a schematic cross sectional view of another embodiment of an LED wafer according to the present invention.

FIG. 5 shows an epitaxial LED wafer 80 that comprises an LED formed on a growth substrate, both of which can be made of the materials described above for substrate 12 and layers 14 described above, and can be arranged in the same way. Bond pads 82 can be included on the wafer 80 that will be used for making electrical contact to LED on the wafer 80. A bonding medium layer 84 is included on the wafer 80, over the bond pads 82. As described above, many different materials can be used for the bonding medium layer, with the preferred material being BCB.

Figure 6A:
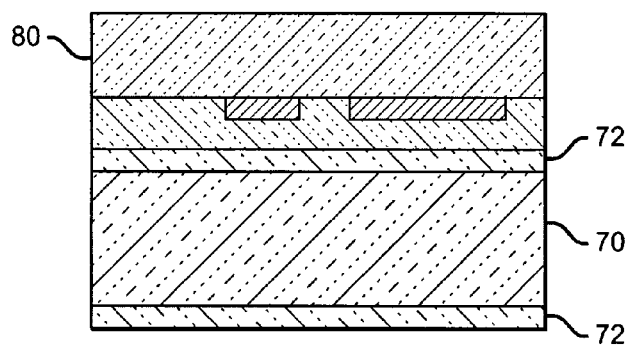
FIGS. 6A-6F are schematic cross sectional views of the submount wafer in FIGS. 4A and 4B wafer bonded to the LED wafer in FIG. 5 according to one embodiment of the present invention.
Figure 6B:
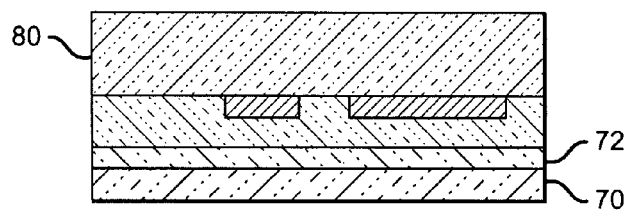

FIG. 6A shows the LED wafer 80 wafer bonded to the submount wafer 70 using any one of the wafer bonding processes described above. Following bonding an etch layer 72 is arranged between the submount wafer 70 and the bonding medium layer 84. Following wafer bonding, the submount wafer can be thinned to allow for easier via etching as shown in FIG. 6B. Typical submount wafers can be 250 to 500 microns thick. Any amount of thinning allows for easier via formation, with a target range of post thinning thicknesses of the submount wafer being 50-100 microns. Different thinning processes can be used including without limitation grinding or back-thinning.

Figure 6C:
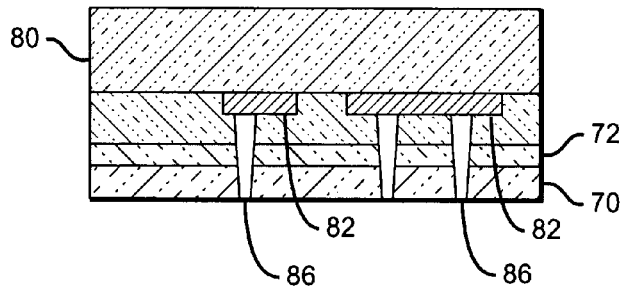

Referring now to FIG. 6C, vias 86 are formed through the submount wafer 70, etch layer 72 and bonding medium layer 84 to the bond pads 82. The vias 86 can be formed using any of the etching processes described above such as chemical, physical or laser etching. The vias 86 can be aligned with the bond pads 82 without using difficult and costly alignment processes. Like the embodiment described above, the preferred submount wafer 70, etch layer 72 and bonding medium layer 84 are substantially transparent in the infrared (IR) or visible wavelength spectrum. This allows for the bond pads 82 to be visible in these spectrums for alignment with the vias 86. Conventional IR or visible mask alignment methods can be used according to the present invention that are less costly and complicated than other alignment processes.

Figure 6D:
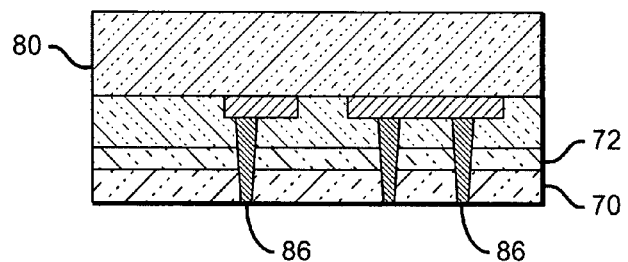

FIG. 6D shows the vias 86 filled or conformally coated with an electrically conductive material. Many different materials can be used as described above, with a suitable material being Cu. Prior to coating or filling, a passivation layer can be included on the inside surface of the vias to reduce or prevent leakage current between the vias. Alternatively, a low temperature doping implantation process can be applied to the surface of the vias.

Figure 6E:
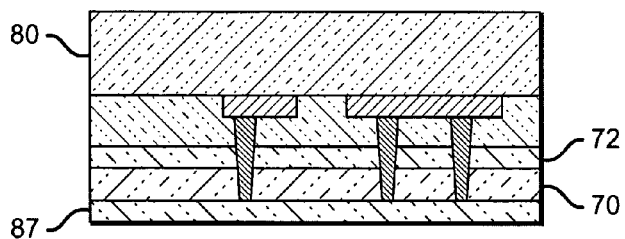
Figure 6F:
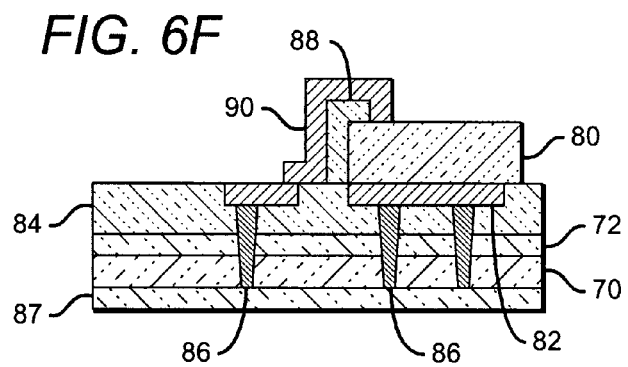

Referring now to FIG. 6E, the backside of the submount wafer 70 can be planarized and metallized with a conductive material 87 using known processes. As part of this fabrication process the LED wafer can be processed at the wafer level from the LED device in contact with the vias 86. Referring now to FIG. 6F, in the embodiment shown the growth substrate can be the top portion of the LED wafer 80 and can be removed from the LED wafer 80 using known processes such as grinding, etching or a combination thereof. The epitaxial layers remain, with the n-type layer on top and the p-type layer adjacent to the bonding medium layer 84. The LED wafer 80 can be further processed at the wafer level to form separate LED devices on the submount wafer 70.

The p-type layer of the submount wafer is in contact with two of the vias 86 through bond pads 82 which allows for an electrical signal to be applied to the p-type layer from the backside of the submount wafer. Electrical contact should be made between the n-type layer and one of the vias 86. This can be accomplished using many different arrangements, and in one embodiment an insulating (passivation) layer 88 can be formed on the edge of the LED wafer 80 as shown and an n-contact conductive layer 90 can be deposited over the insulating layer. The layer 90 forms a conductive path between one of the vias 86 and the LED wafer's n-type layer with the insulating layer 88 protecting against shorting of the conductive path to the p-type (or active layer) of the LED wafer. This arrangement allows for electrical contact to be made to both the n-type layer and p-type layers from the backside of the wafer, through the vias 86. The LED wafers can then be separated into individual devices and the device may be attached directly to a circuit board or other carrier by solder bonding, epoxy bonding or other methods without the need for wire bonding.

It is understood that the LED devices and other devices according to the present invention can be fabricated using different processing steps in different order. For example, the process of removing the growth substrate of the LED wafer 80 can occur at many different points in the fabrication process, such as when the submount wafer 70 is thinned. The vias 86 can also be pre-fabricated in the submount wafer 70 prior to wafer bonding to the LED wafer. The prefabricated vias can comprise the passivation layer along with the conformal coated metal layer.

Other embodiments can also be arranged in different ways. For example, in one embodiment the submount wafer 70, etch layer 72 and bonding medium layer 84 can be sufficiently conductive such that an electrical signal applied to the submount wafer conducts to the p-type layer of the LED wafer 80. In this embodiment, only one via (that is electrically isolated from the surrounding) is needed per device for contacting the n-type layer of the LED wafer. The devices can also be fabricated with reflectors to enhance light extraction and with integrated electronics in the submount wafer. Alternative embodiments can also include phosphors, reflective layers, lenses and combinations thereof.

The embodiments and examples set forth herein were presented to explain the nature of the present invention and its practical application, and thereby to enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. For example, while the use of GaN LED chips is described herein, the invention contemplated is not so limited. One skilled in the art will recognize that the invention may potentially be applied to a variety of semiconductor materials in many different types of devices or applications, and that various semiconductor fabrication technologies may be used.

We claim:

1. A device, comprising:
    at least one integrated circuit chip comprising:
    a first wafer comprising a first surface, a second surface, at least one epitaxial layer on said second surface, and an etch layer on the epitaxial layer, wherein the etch layer defines an opening, further comprising a reflective layer in the opening and a contact on the reflective layer;
    a second wafer comprising a first surface and a second surface;
    a bond medium layer comprising a thermally insulating dielectric material, said second wafer and said bond medium layer at least partially defining a via;
    a passivation material in said via;
    a conductive layer in said via; and
    a thermally conductive material which fully fills said via;
    wherein at least part of a surface of said via is doped; and
    wherein at least one portion of said second surface of said first wafer is bonded to at least one portion of said first surface of said second wafer using said bond medium layer, thereby forming a wafer pair.

2. The device of claim 1, said at least one integrated circuit chip further comprising at least one optical component, wherein the optical component is selected from the group consisting of phosphors, reflective layers, lenses and combinations thereof.

3. An integrated circuit chip comprising:
    a first wafer comprising a first surface, a second surface, at least one epitaxial layer deposited on said second surface, and an etch layer on the epitaxial layer, wherein the etch layer defines an opening, further comprising a reflective layer in the opening and a contact on the reflective layer;
a thermally insulating dielectric material;
a second wafer comprising a first surface and a second surface wherein the second surface of the first wafer and the first surface of the second wafer are bonded together by said thermally insulating dielectric material; and
wherein a surface of said thermally insulating dielectric material and a surface of said second wafer at least partially define a via, a surface of said via comprising a dopant, said via including a conductive layer, wherein a thermally conductive material fully fills said via.

4. The integrated circuit chip of claim 3, wherein said thermally conductive material in said via is in thermal contact with said first wafer.

5. The integrated circuit chip of claim 3, wherein said via passes through said second wafer and exposes said first wafer for electrical contact.

6. The integrated circuit chip of claim 3, wherein at least one portion of the second surface of the second wafer comprises at least two electrical contacts.

7. The integrated circuit chip of claim 3, wherein said first wafer is a device wafer.

8. The integrated circuit chip of claim 3, wherein said second wafer is a submount wafer.

9. The integrated circuit chip of claim 3, further comprising at least one optical component, wherein the optical component is selected from the group consisting of phosphors, reflective layers, lenses and combinations thereof.

10. The integrated circuit chip of claim 3, further comprising a conductive material in said via, wherein said conductive material can be accessed at said second surface of said second wafer.

11. A light emitting diode (LED) chip comprising:
an LED comprising at least one epitaxial layer and an etch layer on the epitaxial layer, wherein the etch layer defines an opening, further comprising a reflective layer in the opening and a contact on the reflective layer;
a dielectric medium layer comprising a thermally insulating material;
a submount comprising a first surface and a second surface, wherein said dielectric medium layer is between said first surface of said submount and said LED, wherein said submount is bonded to said LED by said dielectric medium layer;
an electrically conductive layer in a via at least partially defined by said submount and said dielectric medium layer, said electrically conductive layer accessible from the second surface of said submount to apply an electrical signal to said LED; and
a passivation material in said via;
wherein said via is between said LED and said second surface of said submount, and wherein at least a portion of surface of said via comprises a dopant, and wherein a thermally conductive material fully fills said via.

12. The LED chip of claim 11, wherein said via passes through said submount and said dielectric medium layer, wherein said electrically conductive layer is in electrical contact with said LED.

13. The LED chip of claim 11, wherein at least a portion of said passivation material is beneath said electrically conductive layer in said via.

14. The LED chip of claim 11, further comprising at least one optical component on said LED, wherein the optical component is selected from the group consisting of phosphors, reflective layers, lenses and combinations thereof.

15. The LED chip of claim 11, wherein said LED and said submount are bonded together by said dielectric medium layer.

16. A light emitting diode (LED) chip, comprising:
an LED wafer comprising at least one epitaxial layer and an etch layer on the epitaxial layer, wherein the etch layer defines an opening, further comprising a reflective layer in the opening and a contact on the reflective layer;
a thermally insulating dielectric layer;
a submount wafer, said thermally insulating dielectric layer between said submount wafer and said LED wafer; and
a conductive layer within a via at least partially-defined by said submount wafer and said thermally insulating dielectric layer, said conductive layer accessible from a second surface of said submount wafer to apply an electrical signal to said LED wafer, wherein said submount wafer and said LED wafer are wafer bonded together by said thermally insulating dielectric layer, further comprising a passivation material within said via and a thermally conductive material which fully fills said via, wherein said via is between said LED wafer and said second surface of said submount, wherein at least part of a surface of said via comprises a dopant.

17. A device comprising:
a first wafer comprising a first surface, a second surface, at least one epitaxial layer on said second surface, and an etch layer on the epitaxial layer, wherein the etch layer defines an opening, further comprising a reflective layer in the opening and a contact on the reflective layer;
a thermally insulating dielectric material;
a second wafer comprising a first surface and a second surface wherein the second surface of the first wafer and the first surface of the second wafer are bonded together by said thermally insulating dielectric material; and
a via at least partially defined by said second wafer and said thermally insulating dielectric material, wherein at least part of a surface of said via comprises a dopant, said via including a conductive layer, and wherein a thermally conductive material fully fills said via.

18. The device of claim 17, further comprising a conductive layer within said via.

19. The device of claim 18, further comprising a contact that is aligned with the via, wherein the conductive layer is coupled to the contact.

20. The device of claim 19, wherein the conductive layer is deposited under a bottom surface of the second wafer.

21. The device of claim 17, further comprising a contact that is aligned with the via.

22. The device of claim 17, further comprising a passivation material deposited in the via for electrical isolation.

23. The device of claim 22, wherein the passivation material comprises a dielectric material.

24. The device of claim 22, said via comprising a hole to expose a contact that is aligned to a top of the via.

25. The device of claim 17, wherein the first wafer comprises a substrate and an epitaxial layer on one side of the substrate.

26. The device of claim 25, further comprising an etch layer on the epitaxial layer and wherein the etch layer defines an opening, further comprising a reflective layer in the opening.

27. The device of claim 25, further comprising an etch layer on the epitaxial layer and wherein the etch layer defines an opening and further comprising a contact in the opening.

28. The device of claim 17, wherein the second wafer comprises a submount wafer and a dielectric layer on the submount wafer.

29. The device of claim 28, wherein the via is defined by the submount wafer and the dielectric layer on the submount wafer.

30. A device comprising:
a first wafer comprising a first surface, a second surface and at least one epitaxial layer on said second surface;
a thermally insulating dielectric material;
a second wafer comprising a first surface and a second surface wherein the second surface of the first wafer and the first surface of the second wafer are bonded together by said thermally insulating dielectric material; and
a via at least partially defined by said second wafer and said thermally insulating dielectric material, wherein at least part of a surface of said via comprises a dopant;
wherein the first wafer comprises a substrate and an epitaxial layer on one side of the substrate;
an etch layer on the epitaxial layer and wherein the etch layer defines an opening, further comprising a reflective layer in the opening;
further comprising a contact on the reflective layer.

31. A device, comprising:
at least one epitaxial semiconductor layer;
an etch layer on the at least one epitaxial semiconductor layer, the etch layer defining an opening, further comprising a reflective layer in the opening;
a contact on the reflective layer;
a submount;
a bonding medium layer between the submount and the at least one epitaxial semiconductor layer, wherein the bonding medium layer comprises a thermally insulating material;
a via defined at least partially by the submount and the bonding medium layer, wherein at least a portion of a surface of said via comprises a dopant;
a conductive layer in said via; and
a thermally conductive material which fully fills said via.

32. The device of claim 31, wherein the conductive layer is coupled to a contact that is aligned with the via.

33. The device of claim 31, further comprising a passivation material deposited in the via for electrical isolation.

34. The device of claim 33, wherein the passivation material comprises a dielectric material.

35. The device of claim 33, said via comprising a hole to expose a contact that is aligned to a top of the via.

36. The device of claim 31, wherein the bonding medium layer comprises a dielectric material.

37. A device comprising:
a light emitting device (LED) wafer comprising at least one epitaxial layer and an etch layer on the epitaxial layer, wherein the etch layer defines an opening, further comprising a reflective layer in the opening and a contact on the reflective layer;
a bond pad on the LED wafer opposite a light emission surface;
a submount; and
a bonding medium layer comprising a thermally insulating material on the bond pad and on the LED wafer, wherein the bonding medium layer is between the LED wafer and the submount, a surface of said bonding medium layer at least partially defining a via aligned with said bond pad, at least part of a surface of said via being doped, said via including a conductive layer, wherein a thermally conductive material fully fills said via.

38. The device of claim 37, wherein the submount comprises a submount wafer and an etch mask layer on the submount wafer.

39. The device of claim 38, wherein the etch mask layer is between the submount wafer and the bonding medium layer.

40. The device of claim 38, wherein the via is formed through the submount wafer and formed through the etch mask layer.

41. The device of claim 37, further comprising a passivation material in the via for electrical isolation.

42. The device of claim 41, wherein the passivation material comprises a dielectric material.

43. The device of claim 37, further comprising a backside conductive material on a backside of the submount.

44. The device of claim 43, wherein the backside conductive material is in contact with an electrically conductive material in the via.

45. The device of claim 37, said bonding medium layer at least partially defining a second via aligned with a second bond pad on the LED wafer.

46. The device of claim 37, further comprising:
an insulating layer formed on an edge of the LED wafer; and
a conductive layer deposited over the insulating layer, wherein the conductive layer forms a conductive path between the backside of said submount and the LED wafer.

* * * * *